(12) United States Patent
Hart

(10) Patent No.: US 12,526,920 B1
(45) Date of Patent: Jan. 13, 2026

(54) INDIUM-NIOBIUM SUPERCONDUCTING SOLDER COLUMNS FOR CRYOGENIC AND QUANTUM COMPUTER APPLICATIONS AND METHODS FOR MAKING SAME

(71) Applicant: TopLine Corporation, Irvine, CA (US)

(72) Inventor: Martin B. Hart, Irvine, CA (US)

(73) Assignee: Topline Corporation, Irvine, CA (US)

(*) Notice: Subject to any disclaimer, the term of this patent is extended or adjusted under 35 U.S.C. 154(b) by 0 days.

(21) Appl. No.: 18/630,319

(22) Filed: Apr. 9, 2024

Related U.S. Application Data

(60) Provisional application No. 63/620,646, filed on Jan. 12, 2024.

(51) Int. Cl.
*H05K 1/11* (2006.01)
*B23K 35/02* (2006.01)
(Continued)

(52) U.S. Cl.
CPC ............ *H05K 1/11* (2013.01); *B23K 35/0227* (2013.01); *B23K 35/26* (2013.01); *B23K 35/32* (2013.01);
(Continued)

(58) Field of Classification Search
CPC ........... H05K 1/11; H05K 2201/10242; B23K 35/0227; B23K 35/26; B23K 35/32;
(Continued)

(56) References Cited

U.S. PATENT DOCUMENTS 2,667,237 A    1/1954    Rabinow
2,759,166 A    8/1956    Mallina
(Continued)

FOREIGN PATENT DOCUMENTS

CN    101576138    11/2009
CN    202493618    10/2012
(Continued)

OTHER PUBLICATIONS

U.S. Appl. No. 29/192,710, Universal Lead Straightener for Integrated Circuit Devices, filed Oct. 29, 2003.
(Continued)

*Primary Examiner* — Ishwarbhai B Patel
(74) *Attorney, Agent, or Firm* — Knobbe, Martens, Olson & Bear, LLP

(57) ABSTRACT

A method for making a superconducting, electrically conductive solder column that is mechanically compliant and capable of operating at low cryogenic temperatures for quantum computing and AI computing in datacenters and at elevated temperatures for applications found in extraterrestrial space exploration. The solder column can have an indium alloy core and a surface covered by a braided structure comprising a plurality of small diameter niobium wires coated with a thin layer of indium-alloy. The niobium braided structure can limit deformation of the indium alloy core when the solder column structure is subjected to elevated temperatures exceeding a liquidus temperature of the indium alloy core during the coating process and during post-manufacturing operations. The braided niobium wires can limit the deformation of the indium alloy core when the column structure falls below the ductile to brittle transition temperature during exposure to low cryogenic temperatures.

25 Claims, 9 Drawing Sheets

(51) Int. Cl.
    *B23K 35/26*         (2006.01)
    *B23K 35/32*         (2006.01)
    *H01B 13/00*         (2006.01)
    *H01R 12/51*         (2011.01)
    *H01R 43/02*         (2006.01)
    *B23K 101/42*       (2006.01)
    *H05K 1/18*          (2006.01)

(52) U.S. Cl.
    CPC ......... *H01B 13/0036* (2013.01); *H01R 12/51* (2013.01); *H01R 43/0256* (2013.01); *B23K 2101/42* (2018.08); *H05K 1/18* (2013.01); *H05K 2201/10242* (2013.01)

(58) Field of Classification Search
    CPC .. B23K 2101/42; H01B 13/0036; H01R 12/51; H01R 43/0256
    See application file for complete search history.

(56) References Cited

U.S. PATENT DOCUMENTS

| | | |
|---|---|---|
| 2,790,697 A | 4/1957 | Wockenfuss |
| 3,083,259 A | 3/1963 | Wells |
| 3,141,523 A | 7/1964 | Dickie |
| 3,250,508 A | 5/1966 | Nicholas |
| 3,449,818 A * | 6/1969 | Chase ................. B23K 35/264 505/928 |
| 3,631,297 A | 12/1971 | Conner |
| 3,838,984 A | 10/1974 | Crane |
| 3,871,496 A | 3/1975 | Wigal |
| 3,921,285 A | 11/1975 | Krall |
| 4,040,686 A | 8/1977 | F'Geppert |
| 4,053,943 A | 10/1977 | Galvin |
| 4,118,861 A | 10/1978 | Palmisano |
| 4,125,073 A | 11/1978 | Bain |
| 4,429,656 A | 2/1984 | Wisenberger |
| 4,504,044 A | 3/1985 | Shtarkman |
| 4,541,681 A | 9/1985 | Dorman |
| 4,561,476 A | 12/1985 | Bunkoczy |
| 4,566,231 A | 1/1986 | Konsevich |
| 4,664,309 A | 5/1987 | Allen |
| 4,705,205 A | 11/1987 | Allen |
| 4,712,721 A | 12/1987 | Noel et al. |
| 4,795,016 A | 1/1989 | Schisler |
| 4,842,184 A | 6/1989 | Miller |
| 4,865,324 A | 9/1989 | Nesis |
| 4,872,937 A | 10/1989 | Gouldy |
| 4,873,888 A | 10/1989 | Matsuyama |
| 4,944,875 A | 7/1990 | Gaignet |
| 5,029,748 A | 7/1991 | Lauterbach et al. |
| 5,040,717 A | 8/1991 | McGaffigan |
| 5,092,036 A | 3/1992 | Hu et al. |
| 5,136,470 A | 8/1992 | Sheridon et al. |
| 5,256,370 A * | 10/1993 | Slattery .................. C22C 13/00 219/146.22 |
| 5,323,947 A | 6/1994 | Juskey |
| 5,328,660 A | 7/1994 | Gonya |
| 5,409,236 A | 4/1995 | Therrien |
| 5,426,568 A | 6/1995 | Lamers |
| 5,453,580 A | 9/1995 | Franke |
| 5,497,938 A | 3/1996 | McMahon et al. |
| 5,542,457 A | 8/1996 | Gordon et al. |
| 5,552,209 A | 9/1996 | McCutcheon |
| 5,626,278 A | 5/1997 | Tang |
| 5,640,308 A | 6/1997 | Osann, Jr. et al. |
| 5,678,287 A | 10/1997 | Smith et al. |
| 5,691,037 A | 11/1997 | McCutcheon |
| 5,695,109 A | 12/1997 | Chiang et al. |
| D394,697 S | 5/1998 | Liang |
| 5,788,232 A | 8/1998 | Binkley |
| 5,834,689 A | 11/1998 | Cook |
| D402,273 S | 12/1998 | Kataoka |
| D402,274 S | 12/1998 | Kataoka |
| D407,383 S | 3/1999 | Kataoka |
| 5,914,864 A | 6/1999 | MacDonald |
| 5,945,643 A | 8/1999 | Casser |
| 5,958,556 A | 9/1999 | McCutcheon |
| 6,014,993 A | 1/2000 | Goins, III |
| 6,026,566 A | 2/2000 | Urban et al. |
| D421,968 S | 3/2000 | Matsumura |
| D426,522 S | 6/2000 | Matsumura |
| D432,504 S | 10/2000 | Matsumura |
| 6,136,128 A | 10/2000 | Chung |
| 6,151,930 A | 11/2000 | Carlson |
| 6,204,678 B1 | 3/2001 | Akram |
| 6,251,767 B1 | 6/2001 | Heinen |
| 6,259,155 B1 * | 7/2001 | Interrante ......... H01L 23/49894 257/E23.068 |
| 6,276,596 B1 | 8/2001 | Gruber et al. |
| 6,287,126 B1 | 9/2001 | Berger |
| 6,296,173 B2 | 10/2001 | Davis et al. |
| 6,313,523 B1 | 11/2001 | Morris et al. |
| 6,362,969 B1 | 3/2002 | Furst |
| 6,412,685 B2 | 7/2002 | Hertz |
| 6,429,388 B1 | 8/2002 | Interrante et al. |
| 6,454,063 B1 | 9/2002 | Osterberg et al. |
| 6,459,211 B1 | 10/2002 | Wang |
| 6,547,049 B1 | 4/2003 | Tomlinson |
| 6,557,752 B1 | 5/2003 | Yacoob |
| 6,570,260 B1 * | 5/2003 | Yeh ........................ B23K 35/26 257/772 |
| 6,643,221 B1 | 11/2003 | Hsu et al. |
| 6,659,778 B2 | 12/2003 | Li |
| 6,672,876 B1 | 1/2004 | Takekoshi |
| 6,740,822 B2 | 5/2004 | Watanabe |
| 6,785,148 B1 | 8/2004 | Ishida |
| D503,691 S | 4/2005 | Standing |
| 6,948,940 B2 | 9/2005 | Lindsey |
| 6,955,285 B2 | 10/2005 | Shinichi |
| D512,970 S | 12/2005 | Hart |
| 7,234,986 B2 | 6/2007 | Kowalski |
| 7,461,728 B2 | 12/2008 | Huston et al. |
| 7,523,852 B2 | 4/2009 | Buchwalter |
| 7,566,575 B2 | 7/2009 | Murata |
| 7,569,474 B2 | 8/2009 | Teo |
| 7,754,343 B2 | 7/2010 | Love et al. |
| 7,839,041 B2 | 11/2010 | Mohler |
| D638,096 S | 5/2011 | Taylor |
| 8,177,201 B2 | 5/2012 | Goudie |
| 8,220,692 B2 | 7/2012 | Ohnishi et al. |
| 8,272,786 B2 | 9/2012 | Cottrell |
| 8,277,255 B2 | 10/2012 | Consoli |
| 8,291,567 B1 | 10/2012 | Keenan et al. |
| 8,739,392 B2 | 6/2014 | Byquist |
| 8,905,637 B2 | 12/2014 | Tybinkowski |
| 8,985,935 B2 | 3/2015 | Tan et al. |
| D735,292 S | 7/2015 | Johnson |
| D736,284 S | 8/2015 | Maurer |
| 9,108,262 B1 | 8/2015 | Hart |
| 9,257,765 B2 | 2/2016 | Rathi |
| 9,521,753 B1 | 12/2016 | Hunt |
| 9,629,259 B1 | 4/2017 | Hart |
| 9,717,148 B2 | 7/2017 | Hahn |
| 9,835,083 B2 | 12/2017 | Cunningham |
| 9,835,219 B2 | 12/2017 | Krus |
| D808,350 S | 1/2018 | Hart |
| 10,006,513 B1 | 6/2018 | Wang |
| 10,021,779 B1 | 7/2018 | Hart |
| 10,041,558 B1 | 8/2018 | Hart |
| D842,351 S | 3/2019 | Hart |
| 10,477,698 B1 | 11/2019 | Hart |
| D874,413 S | 2/2020 | Hart |
| 10,704,639 B2 | 7/2020 | Hart |
| D908,648 S | 1/2021 | Hart |
| 10,937,752 B1 | 3/2021 | Hart |
| 2002/0011832 A1 | 1/2002 | Berkcan |
| 2002/0102767 A1 | 8/2002 | Sturcken |
| 2002/0121414 A1 | 9/2002 | Barcock |
| 2002/0148971 A1 | 10/2002 | Sogard |
| 2003/0013322 A1 | 1/2003 | Choy et al. |
| 2003/0066681 A1 | 4/2003 | Uchida et al. |
| 2003/0117031 A1 | 6/2003 | Wang |
| 2004/0015154 A1 | 1/2004 | Harper |

(56) References Cited

U.S. PATENT DOCUMENTS

| | | |
|---|---|---|
| 2004/0070307 A1 | 4/2004 | Haugan |
| 2004/0144834 A1 | 7/2004 | Nomoto |
| 2004/0173891 A1* | 9/2004 | Imai ................ H05K 3/3436 |
| | | 257/686 |
| 2005/0284576 A1 | 12/2005 | America |
| 2006/0077641 A1 | 4/2006 | Lavergne |
| 2006/0111032 A1 | 5/2006 | Weston |
| 2006/0175169 A1 | 8/2006 | Or et al. |
| 2006/0180420 A1 | 8/2006 | Rongong et al. |
| 2007/0068756 A1 | 3/2007 | Huston et al. |
| 2007/0071605 A1 | 3/2007 | Gazzillo |
| 2007/0078477 A1 | 4/2007 | Heneveld |
| 2007/0186784 A1 | 8/2007 | Liverani |
| 2007/0262875 A1 | 11/2007 | El-Ibiary |
| 2008/0003846 A1 | 1/2008 | Miyagawa |
| 2008/0157914 A1 | 7/2008 | Pokharna |
| 2008/0246372 A1 | 10/2008 | Melz |
| 2009/0044561 A1 | 2/2009 | Dalton |
| 2009/0122505 A1 | 5/2009 | Lu |
| 2009/0184200 A1 | 7/2009 | Lin |
| 2009/0223710 A1 | 9/2009 | Becker |
| 2009/0258168 A1 | 10/2009 | Barcock |
| 2009/0267227 A1 | 10/2009 | Dando |
| 2009/0279275 A1 | 11/2009 | Ayotte et al. |
| 2010/0320046 A1 | 12/2010 | Provost |
| 2011/0100667 A1 | 5/2011 | Hardie |
| 2011/0108312 A1 | 5/2011 | Becze |
| 2011/0239981 A1 | 10/2011 | Cunningham |
| 2012/0024646 A1 | 2/2012 | Tsugihashi |
| 2012/0038042 A1* | 2/2012 | Sasaki ................ C22C 13/02 |
| | | 257/737 |
| 2012/0052352 A1 | 3/2012 | Brilmyer |
| 2012/0168271 A1 | 7/2012 | Ryaboy |
| 2014/0262498 A1 | 9/2014 | Hester |
| 2014/0284086 A1 | 9/2014 | Iwase |
| 2015/0171531 A1 | 6/2015 | Rathi |
| 2015/0252851 A1 | 9/2015 | Tate |
| 2017/0016327 A1 | 1/2017 | Yaakoby |
| 2017/0064811 A1 | 3/2017 | Li |
| 2017/0071826 A1 | 3/2017 | Py |
| 2017/0144090 A1 | 5/2017 | Lin |
| 2017/0334552 A1 | 11/2017 | Seifert |
| 2017/0335915 A1 | 11/2017 | Nyboer |
| 2018/0102469 A1* | 4/2018 | Das ................ H01L 25/0652 |
| 2022/0130784 A1 | 4/2022 | Zhang et al. |

FOREIGN PATENT DOCUMENTS

| | | |
|---|---|---|
| CN | 103498884 | 1/2014 |
| CN | 105097659 | 11/2015 |
| CN | 105937573 | 9/2016 |
| CN | 115770972 | 3/2023 |
| GB | 2142568 | 1/1985 |
| JP | 2003-194142 | 7/2003 |
| JP | 2006-233993 | 9/2006 |

OTHER PUBLICATIONS

U.S. Appl. No. 14/468,180, Disposable Apparatus for Aligning and Dispensing Solder Columns in an Array, filed Aug. 25, 2014.

U.S. Appl. No. 15/238,437, Refillable Apparatus for Aligning and Depositing Solder Columns in a Column Grid Array, filed Aug. 16, 2016.

U.S. Appl. No. 29/596,169, Fixture for Delivering Interconnect Members Onto a Substrate, filed Mar. 6, 2017.

U.S. Appl. No. 15/727,371, Tunable Apparatus for Adjusting Effective Performance of Particle Impact Damper, filed Oct. 6, 2017.

U.S. Appl. No. 15/824,915, Quick Response Particle Damper for Printed Circuit Boards and Planar Surfaces, filed Nov. 28, 2017.

U.S. Appl. No. 29/634,593, Toroidal Shaped Particle Impact Damper, filed Jan. 23, 2018.

U.S. Appl. No. 16/103,817, Unidirectional Particle Damper for Printed Circuit Boards and Planar Surfaces, filed Aug. 14, 2018.

U.S. Appl. No. 29/668,830, Fixture for Delivering 1752 Solder Columns Onto a Substrate, filed Nov. 2, 2018.

U.S. Appl. No. 16/440,905, Solder Columns and Methods for Making Same, filed Jun. 13, 2019.

U.S. Appl. No.29/716,908, Adjustable Fixture for Aligning Column Grid Array Substrates, filed Dec. 12, 2019.

U.S. Appl. No. 16/983,983, Lead Free Solder Columns and Methods for Making Same, filed Aug. 3, 2020.

Cooper Tools, Weller WLSK1000 QFP Lead Repair Kit, CT97-0400/GP-92902/5M/PRINTED 06/98/USA Cooper No. 55580-120-5 Copyright © 1998, Cooper Industries, Inc.

* cited by examiner

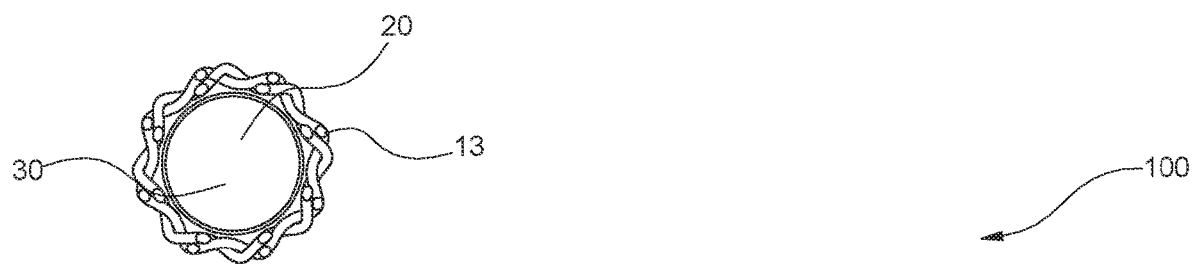
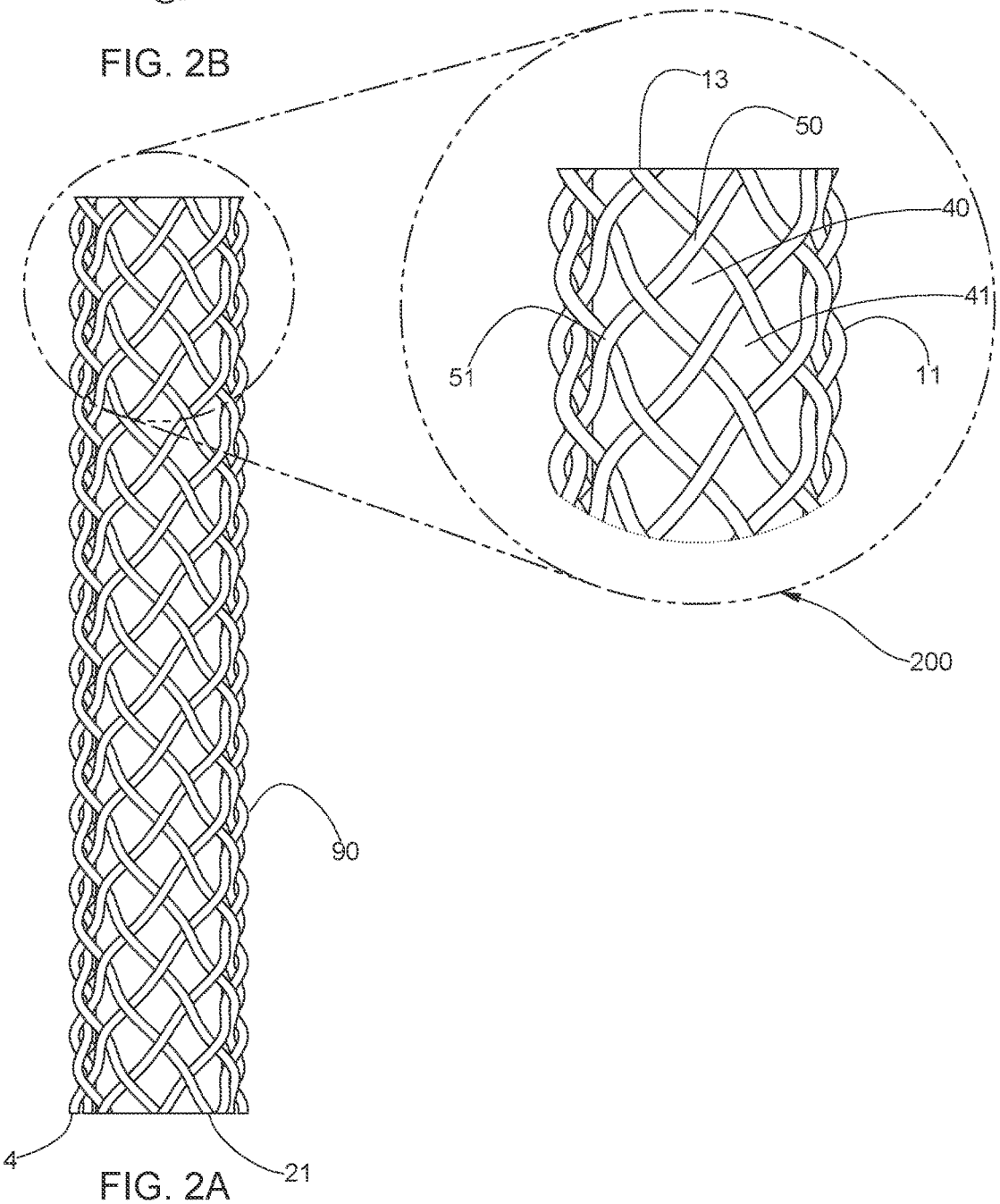
FIG. 2B
FIG. 2A

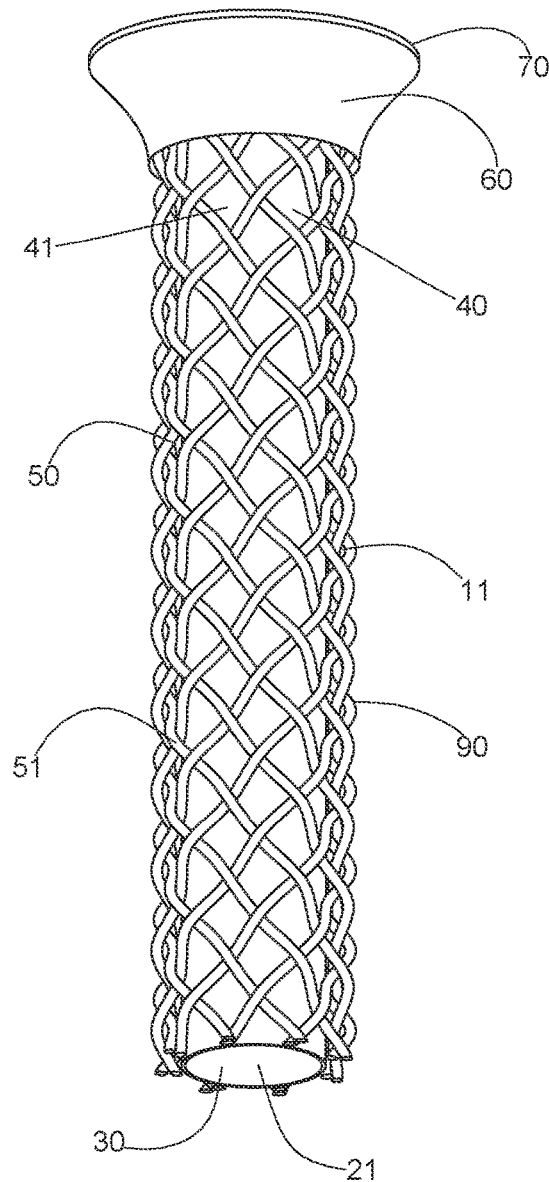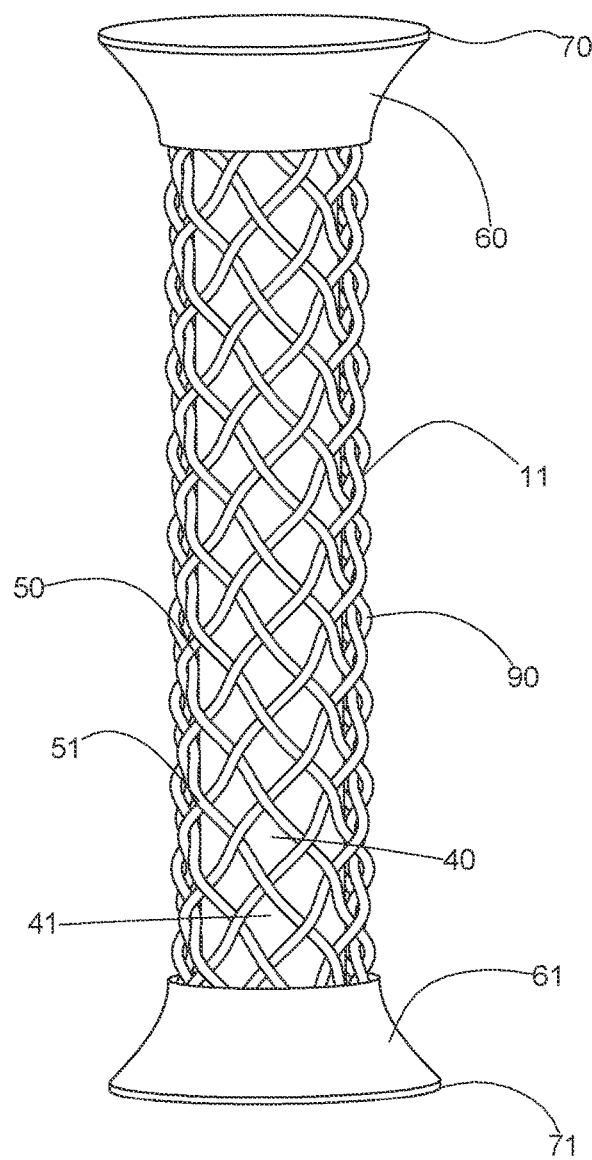
FIG. 5A                    FIG. 5B

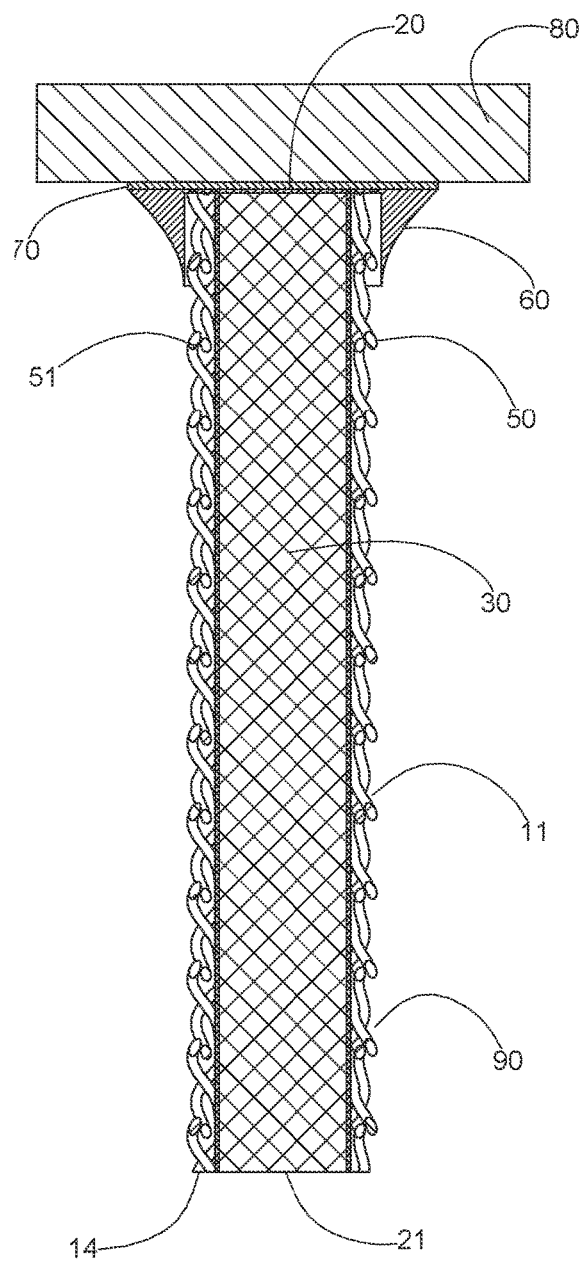
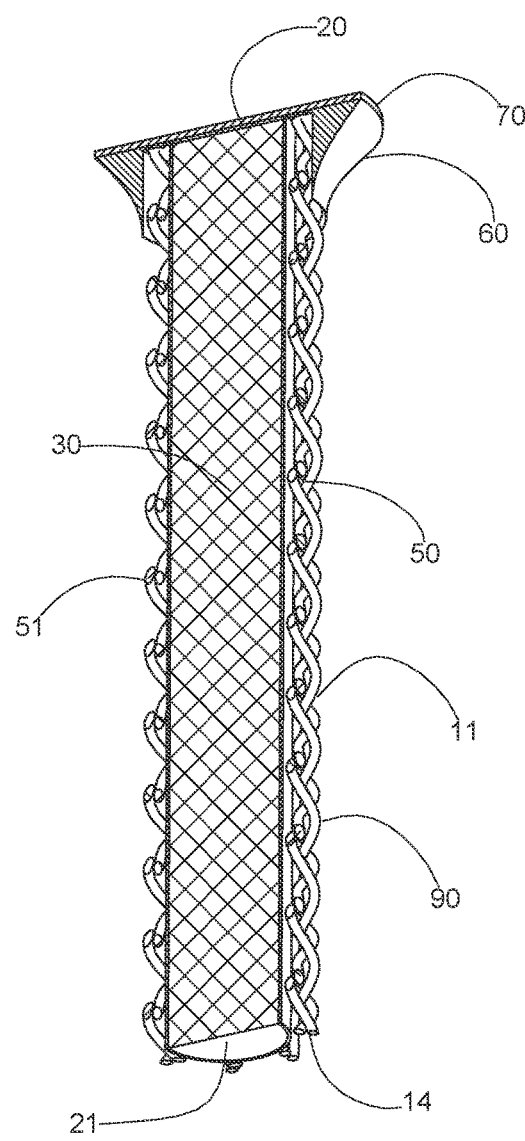
FIG. 6A
FIG. 6B

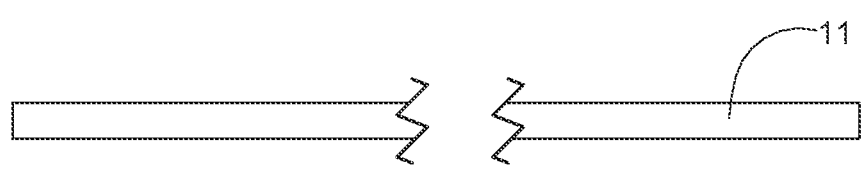
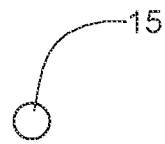
FIG. 9A   FIG. 9B
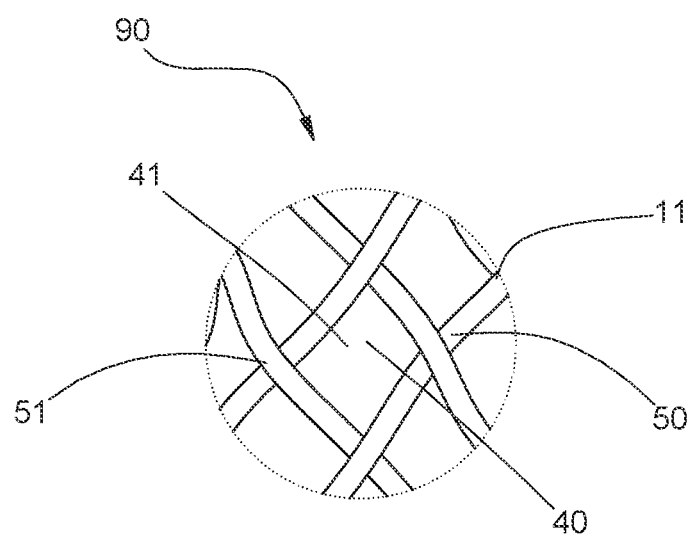
FIG. 10

INDIUM-NIOBIUM SUPERCONDUCTING SOLDER COLUMNS FOR CRYOGENIC AND QUANTUM COMPUTER APPLICATIONS AND METHODS FOR MAKING SAME

INCORPORATION BY REFERENCE TO ANY PRIORITY APPLICATIONS

This application claims the benefit of U.S. Provisional Application No. 63/620,646, filed on Jan. 12, 2024, which is incorporated by reference herein in their entirety. Any and all applications for which a foreign or domestic priority claim is identified in the Application Data Sheet as filed with the present application are hereby incorporated by reference under 37 CFR 1.57 for all purposes and for all that they contain.

BACKGROUND

Field of the Disclosure

Embodiments of the present disclosure relate generally to solder column structures, for example, solder column structures made from indium alloy and niobium alloy and one or more methods for making such structures.

Description of the Related Art

Typically, intermetallic connections are formed between a plurality of solder columns and the conductive pads on a land grid array (LGA) module or substrate. Initially, a layer of solder paste is applied to cover the array of conductive pads on the LGA. After heating, the solder paste reflows on the conductive pads causing an intermetallic connection between the solder columns and the conductive pads on the LGA. The LGA substrate material may consist of ceramic, aluminum-nitride (AlN), plastic, glass or silicon materials. After completion of the reflow process, the LGA with solder columns is known in the art as a column grid array (CGA) or ceramic column grid array (CCGA). In general, the number of solder columns on a CGA device may range from 4 to 100,000, or more, as the density of electronic devices and integrated circuit packages continues to increase.

An alternative to CGA column grid array devices is ball grid array (BGA) devices. BGA devices contain an array of solder spheres (balls) to provide electrical connections between the conductive pads on a BGA substrate and the printed circuit board (PCB). In the art, BGA substrates that are constructed of ceramic material (such as alumina or $Al_2O_3$) are known as a ceramic ball grid array (CBGA). Ceramic substrates are often required in harsh environments or when excessive heat and power is present.

However, one potential problem with BGA devices is that a substantial difference in the coefficient of thermal expansion (CTE) can exist between BGA devices and the PCB board. The potential problem with CTE differences typically becomes more problematic when large size BGA devices are attached to PCB boards that are made of plastic glass-woven material such as FR-4 or other laminate materials. Such differences in the coefficient of thermal expansion can cause deformation of the solder spheres (solder balls) interconnecting a BGA device to a PCB board. Over time, the electrical connection between the solder ball and metal pad can break between large size BGA devices and a plastic glass-woven PCB due to CTE mismatching issues.

The problem with CTE mismatch has been addressed by using cylindrical solder columns instead of solder spheres (solder balls) as the electrical interconnect between LGA semiconductor module substrates and PCB boards. Taller cylindrically shaped solder columns are generally more compliant to better absorb CTE differential thermal expansion rates between the CGA and the PCB board. Columns must generally be more structurally robust to support the load weight of heavy, large CGA substrates. However, the diameter of the solder column is normally constrained by the pitch (spacing) of the conductive pads on the CGA package as well as by the diameter of the conductive pads on the PCB boards.

Another problem is that the mechanical integrity of the electrical interconnect member can crumble when the operating temperature is reduced in the cryogenic temperature range below the Ductile to Brittle Transition Temperature (DBTT) of the materials comprising the electrical interconnect member.

Cryogenic operating temperatures can be encountered, for example, on the surface of the moon or in land-based environments present in the operation of quantum computers and computers cooled with cold plates or other means such as found in applications involving Artificial Intelligence (AI).

Applications of quantum computers generally perform better when operated at temperatures below the superconductivity point where the resistance of certain materials drops to zero allowing current to flow without energy loss.

Solder columns and solder balls are generally referred to as electrical interconnect member(s).

Yet another problem is that the mechanical integrity of the electrical interconnect member can soften, deform, melt, or collapse when the operating temperature is elevated above the liquidus temperature rating of the materials comprising the electrical interconnect member.

In an operating environment such as encountered on the surface of the moon or in extraterrestrial space, an electrical interconnect member can be subjected some of the time to extremely elevated temperatures which exceed the liquidus temperature rating of an electrical interconnect member material while at other times the same electrical interconnect member can be subjected to cryogenically cold temperatures.

For example, operating environments in Lunar exploration require the apparatus to function at extremely low temperatures (below −190° C.) at night part of the time and at elevated temperatures (above +120° C.) during the day at other times. Such excursions from low temperature to high temperature may result in numerous, recurring temperature swings which have a tendency to cause thermal fatigue damage over a space mission.

As another example, operating environments in quantum computing require the apparatus to function at extremely low temperatures near absolute zero kelvin (around −273° C.) and at elevated temperatures (above +260° C.) for short durations during initial assembly. Such excursions from initial high temperature during assembly to low temperatures during functional operations may cause thermal fatigue damage.

SUMMARY OF SOME EXAMPLE EMBODIMENTS

Disclosed herein are embodiments of an improved solder column. In some embodiments, the improved solder column can be used in cryogenic environments. In some embodiments, the improved solder column can be used for quantum computer applications.

In some embodiments, the solder column can have a solder core comprising a solder core material, an exoskeleton sleeve structure coupled with the solder core, a plurality of spaces formed in the exoskeleton between the plurality of wires. The spaces can be configured to provide additional flexibility to the solder column to improve the ability of the solder column to absorb stresses caused by mismatches in the coefficient of thermal expansion between the substrates interconnected by the solder column. In some embodiments, the exoskeleton sleeve can at least partially surround the solder core. The exoskeleton sleeve structure of any embodiments disclosed herein can include a plurality of wires that at least partially surround the solder core. In some embodiments, the solder core can include at least 20% indium by weight, or can each include at least 20% Niobium by weight.

In some embodiments, the solder column can the solder core can include at least 50% indium by weight. In some embodiments, the solder column can the solder core can include at least 80% indium by weight. In some embodiments, the exoskeleton sleeve structure can include a plurality of wires that are braided together to form a woven mesh that at least partially surround the solder core. In some embodiments, the plurality of wires of the exoskeleton sleeve structure each can include at least 50% niobium by weight, or each can include at least 80% niobium by weight.

In some embodiments, the exoskeleton sleeve at least partially surrounds and supports the solder core at elevated temperatures exceeding a liquidus temperature of the solder core to prevent a collapse of the solder core at elevated temperatures exceeding the liquidus temperature of the solder core. In some embodiments, the solder column can be configured such that solder from the solder core will form a bond with conductive pads of an LGA/CGA and/or a printed circuit board without the solder core collapsing when a temperature that the solder column is exposed to rises above the liquidus temperature of the solder core material. In some embodiments, the solder column can be configured such that solder from the solder core will form a bond with conductive pads of an LGA/CGA and/or a printed circuit board—without the solder core collapsing when a temperature that the solder column is exposed to falls below the ductile to brittle transition temperature of the solder core material.

In some embodiments, at least a portion of a thickness of the exoskeleton sleeve can be embedded into the solder core. In some embodiments, the exoskeleton sleeve can include 4, 8, 12, 16, 20, 24, 32 or 48 strands of wire. In some embodiments, the solder column can one or more of the wires can have a diameter of approximately 0.002 inches (0.05 mm) or less. In some embodiments, the exoskeleton sleeve can include a first wire that overlaps and intersects with a second wire at approximately a 90° angle relative to the second wire. In some embodiments, the plurality of spaces can be partially or fully filled with solder comprising 100% by weight Indium or an Indium alloy comprising at least 75% Indium by weight.

Also disclosed herein are embodiments of a solder column that can include a solder core having a solder core material, an exoskeleton sleeve structure coupled with the solder core and at least partially surrounding the solder core, and a plurality of spaces formed in the exoskeleton between the plurality of wires.

In some embodiments, the exoskeleton sleeve structure can include a plurality of wires that form a mesh that is configured to support the solder core, particularly at elevated temperatures exceeding a liquidus temperature of the solder core, and to improve the functionality of the solder column at low cryogenic operating temperatures. The spaces can be configured to provide additional flexibility to the solder column to improve the ability of the solder column to absorb stresses caused by mismatches in the coefficient of thermal expansion between the substrates interconnected by the solder column. In some embodiments, the solder core can include 100% by weight indium or an indium alloy that is greater than 20% indium by weight. The one or more of the wires of any solder core embodiments disclosed herein can include at least one of niobium or a niobium alloy.

Also disclosed herein are embodiments of a printed circuit board that can include one or a plurality of any embodiments of the solder columns disclosed herein, wherein the circuit board is configured such that solder from the solder core will form a bond with conductive pads of the printed circuit board without the solder core collapsing when a temperature that the solder column is exposed to rises above the liquidus temperature of the solder core material. Also disclosed herein are embodiments of a land grid array that can include one or a plurality of any embodiments of the solder columns disclosed herein, wherein the land grid array is configured such that solder from the solder core will form a bond with conductive pads of the land grid array without the solder core collapsing when a temperature that the solder column is exposed to rises above the liquidus temperature of the solder core material. Also disclosed herein are embodiments of a column grid array that can include one or a plurality of any embodiments of the solder columns disclosed herein, wherein the column grid array is configured such that solder from the solder core will form a bond with conductive pads of the column grid array without the solder core collapsing when a temperature that the solder column is exposed to rises above the liquidus temperature of the solder core material.

Some embodiments disclosed herein are directed to a method for making an electrically conductive solder column that is mechanically compliant and capable of operating at low cryogenic temperatures and at elevated temperatures for applications found in extraterrestrial space exploration as well as for quantum computing and AI computing in datacenters. In some embodiments, the solder column can include an indium alloy core having a surface that is covered by a braided structure comprising a plurality of (e.g., without limitation, 8 to 16, or 10 to 14, or any value or range of values in any of the foregoing ranges) small diameter niobium wires. The wires can have a small diameter or any diameter or range of diameters disclosed herein. The column can, in some embodiments, be coated with a thin layer of indium-alloy which covers and bonds the niobium alloy braided structure to the indium alloy core. In some embodiments, the niobium braided structure can limit deformation of the indium alloy core when the solder column structure is subjected to elevated temperatures exceeding a liquidus temperature of the indium alloy core during the coating process as well as during post-manufacturing operations. Additionally, the braided niobium wires can, in some embodiments, limit the deformation of the indium alloy core when the column structure falls below the ductile to brittle transition temperature during exposure to low cryogenic temperatures. The solder column may be cut into a plurality of individual solder columns of desired length with one end of a solder column bonded to a plurality of conductive pads on semiconductor modules. During a secondary procedure, the other end of a column can be bonded to a printed circuit board or to another microelectronic module in order to conduct electrical signals through the solder column between a semiconductor module and a printed circuit board or microelectronic module.

Also disclosed herein are embodiments of a method of making an electrically conductive solder column, comprising providing a solder core comprising indium or an indium alloy; and covering an outer surface of the solder core with a braided structure comprising a plurality of wires comprising niobium or a niobium alloy. In some embodiments, the braided structure can be made from 8 to 16 small diameter niobium wires. In some embodiments, the method includes coating the solder core and the braided structure with a layer of an indium alloy, wherein the layer of the indium alloy covers the niobium alloy braided structure and the indium alloy core. In some embodiments, the layer of the indium alloy bonds the niobium alloy braided structure to the indium alloy core. The braided structure can be configured to limit deformation of the solder core when the solder column is subjected to elevated temperatures exceeding a liquidus temperature of the solder core during the coating process as well as during post-manufacturing operations, and is configured to limit the deformation of the solder core when the solder column falls below a ductile to brittle transition temperature during exposure to low cryogenic temperatures. In some embodiments, the solder column is mechanically compliant and capable of operating at low cryogenic temperatures and at elevated temperatures for applications found in extraterrestrial space exploration as well as for quantum computing and AI computing in datacenters.

BRIEF DESCRIPTION OF THE DRAWINGS

FIG. 2A is a side view of the embodiment of the solder column shown in FIG. 1, showing the solder core and the exoskeleton sleeve of the solder column after the solder core and exoskeleton sleeve embodiment has been immersion coated in a molten solder bath.

FIG. 2B is a top view of the embodiment of the solder column shown in FIG. 1.

FIG. 5A is a perspective view of the solder column embodiment shown in FIG. 1 after reflowing one end of the column to a conductive pad of an LGA/CGA substrate.

FIG. 5B is a perspective view of the solder column embodiment shown in FIG. 5A after reflowing the other end of the solder column to a conductive pad on the PC Board.

FIG. 6A is a cross-sectional view of the solder column and exoskeleton sleeve embodiment shown in FIG. 5A attached to an LGA/CGA substrate.

FIG. 6B is a perspective view of the cross-section of the solder column embodiment shown in FIG. 6A.

FIG. 9A is a partial side view of an embodiment of a single strand of round wire that can be used in any embodiments of the exoskeleton sleeves disclosed herein, including without limitation the exoskeleton sleeve of the solder column embodiment shown in FIG. 1.

FIG. 9B is an end view of the embodiment of the strand of wire shown in FIG. 9A.

FIG. 10 is a partial detail view of an embodiment of an exoskeleton sleeve comprising a wire braid or mesh of overlapping wire strands that can include any embodiments of the wire strands disclosed herein or any combination of the embodiments of the wire strands disclosed herein, including without limitation the wire strands shown in FIG. 9A and/or FIG. 9B.

DETAILED DESCRIPTION

Figure 1:
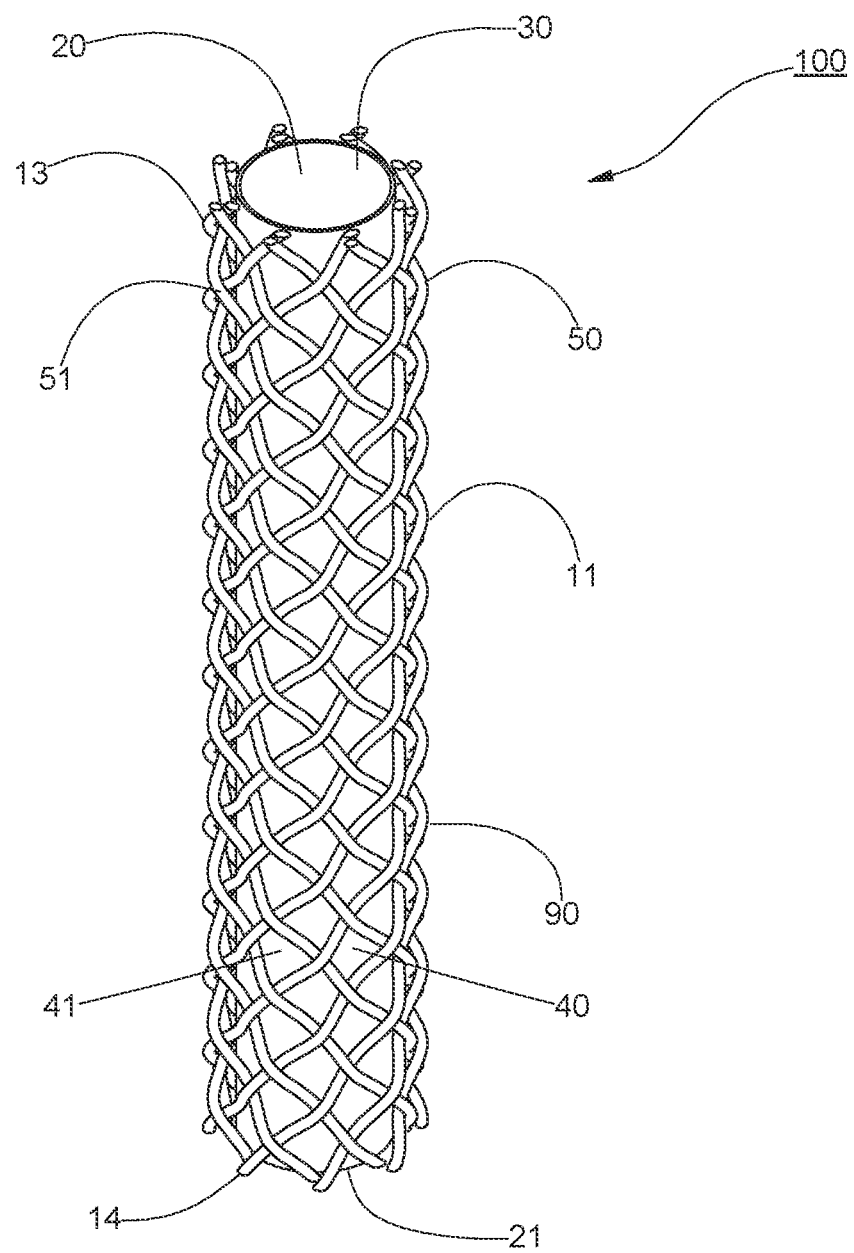
FIG. 1 is a perspective view of an embodiment of a solder column that includes a solder core surrounded by an exoskeleton sleeve comprising a plurality of round wires.

Traditionally, solder columns intended to be used in applications in the military, aerospace and defense fields are cylindrically shaped and typically have a diameter of approximately 0.50 mm (0.020-inch) or from 0.25 mm or approximately 0.25 mm to 0.75 mm or approximately 0.75 mm and a height of approximately 2.2 mm (0.087-inch) or from 1.5 mm or approximately 1.5 mm or less than 1.5 mm to 2.7 mm or approximately 2.7 mm or more than 2.7 mm, or of any value, approximate value, or range of values in any of the foregoing ranges.

The conductive pads on the land grid array (LGA) substrate may be covered with a controlled thickness of solder paste before attaching a plurality of solder columns to the LGA substrate. In some cases, solder paste consisting of tin-lead alloy, such as Sn63/Pb37, is preferred for applications within the fields of aerospace, military and defense industries where operating temperatures do not generally drop below −89° C. However, in commercial fields, lead free solder paste alloys consisting of a combination of tin (Sn), silver (Ag), copper (Cu) or bismuth (Bi), or other additives, may be used for applications where operating temperatures do not generally fall below −89° C.

Solder columns are generally vertically positioned perpendicularly onto a corresponding array of conductive pads on the LGA substrate. The substrate, together with high melting temperature solder columns and a layer of low melting temperature solder paste are typically heated so that the solder paste is reflowed to make an intermetallic fillet connection between the solder columns and the LGA conductive pads, without melting or damaging the solder columns. The completed package with attached solder columns is known in the art as a column grid array (CGA) or ceramic column grid array (CCGA) package.

A secondary procedure is typically required to mount the CGA package onto the PCB board. The process of connecting the CGA package to the PCB board requires the CGA to be reflowed again, without collapsing the solder columns. A controlled layer of low melting temperature solder paste can be applied to a corresponding plurality of contact pads on the PCB board. The solder columns on the CGA package can be placed onto the solder paste covered pads on the PCB board. The PCB board along with one or a plurality of CGA packages (as well as other components) can then be heated and reflowed, which can result in an intermetallic fillet that holds the CGA solder columns to the PCB board.

Conventional processes have put a focus on avoiding collapse of the vertically positioned column(s) during the reflow process by selecting column materials with higher melting points compared to the onset of melting of the solder paste that wets and joins the column to the metal pads on the CGA package to the PCB boards.

Therefore, a better solution to solder columns must be developed to overcome each of these drawbacks and limitations. In particular, a more robust and reliable method and structure for maintaining the columnar shape and structural integrity of the solder column without embrittlement, deformation and cracking when subjected to extremely cold cryogenic operating temperatures as well as to elevated operating temperatures is needed, for example and without limitation, an improved structure comprised of an indium alloy core with a niobium alloy exoskeleton braided sleeve that assures that the solder columns retain their full mechanical, electrical and thermal integrity without collapsing during reflow of the columns to the LGA, and secondarily when the CGA IC chip package is reflowed to the PC Board. Furthermore, there is a need for a compliant structure comprised of an indium alloy core with a niobium alloy exoskeleton braided sleeve for absorbing mechanical stresses caused by CTE mismatch, while conducting electrical signals with minimum of distortion.

The embodiments of the present disclosure provide solutions to the aforementioned needs. The details of such embodiments will be described in greater detail below.

In some embodiments, indium alloy is combined with a niobium alloy to form a compliant column structure that can be used at cryogenic temperatures as well as at elevated temperatures to absorb mechanical stress(es) caused by differences in the coefficients of thermal expansion of mating or abutting materials or components for passing electrical signals between semiconductor microelectronics or integrated circuit modules used in extraterrestrial space or in quantum computer servers, and to provide an interconnect in an array pattern on ceramic, aluminum-nitride, organic, glass or silicon substrates when joining microelectronic packages to corresponding metal pads on printed circuit boards.

Some embodiments of the solder columns disclosed herein are configured to provide an improved method of interconnecting a plurality of columns to arrays of semiconductor microelectronic modules that can survive harsh operating conditions found in both cryogenic temperatures and elevated temperatures.

Some embodiments of the solder columns disclosed herein are configured to provide an interconnect for electrically coupling and structurally supporting a semiconductor microelectronic module in juxtaposition to another semiconductor microelectronic module or PC Board.

Some embodiments of the solder columns disclosed herein are configured to provide an electrical interconnect member that is mechanically compliant without breaking due to stresses encountered by CTE mismatch.

Solder columns used in fields of quantum computer servers, artificial intelligence (AI), machine learning (ML), military, defense, aerospace and micro-electronics in general, may be as small as 0.20 mm (0.008-inch) in diameter or more than 0.90 mm (0.0354-inch) in diameter. Furthermore, the length of solder columns may be as short as 0.40 mm (0.016-inch) or as long as 3.81 mm (0.150-inch) or more.

The diameter of solder columns in some embodiments are typically not less than 50% of the diameter of the LGA conductive pads and not greater than 75% of the diameter of the LGA conductive pads. The combined diameter of the indium or indium alloy core plus four (4×) times the diameter of the niobium or niobium alloy braid typically form the total diameter of the solder column.

Table 1 below provides some examples of the nominal dimensions of the materials that can be included in the solder core and the braid of any solder column device embodiments or manufacturing method embodiments disclosed herein. Dimensions of the materials shown can be more than or less than the amounts shown.

TABLE 1

| Solder Column Diameter | Indium Alloy core Diameter | Niobium Alloy Diameter | LGA Pad Diameter Minimum | LGA Pad Diameter Maximum |
| --- | --- | --- | --- | --- |
| 0.20 mm | 0.10 mm | 0.025 mm | 0.27 mm | 0.40 mm |
| 0.25 mm | 0.15 mm | 0.025 mm | 0.33 mm | 0.50 mm |
| 0.30 mm | 0.20 mm | 0.025 mm | 0.40 mm | 0.60 mm |
| 0.35 mm | 0.25 mm | 0.025 mm | 0.46 mm | 0.70 mm |
| 0.40 mm | 0.25 mm | 0.038 mm | 0.50 mm | 0.80 mm |
| 0.45 mm | 0.30 mm | 0.038 mm | 0.53 mm | 0.90 mm |
| 0.50 mm | 0.35 mm | 0.038 mm | 0.62 mm | 1.00 mm |
| 0.55 mm | 0.35 mm | 0.050 mm | 0.66 mm | 1.10 mm |
| 0.55 mm | 0.40 mm | 0.038 mm | 0.68 mm | 1.10 mm |
| 0.60 mm | 0.40 mm | 0.050 mm | 0.73 mm | 1.20 mm |
| 0.70 mm | 0.50 mm | 0.050 mm | 0.93 mm | 1.40 mm |
| 0.80 mm | 0.60 mm | 0.050 mm | 1.06 mm | 1.60 mm |
| 0.90 mm | 0.70 mm | 0.050 mm | 1.20 mm | 1.80 mm |

The length of solder columns in some embodiments are typically not less than three (3×) times the diameter of the solder column (e.g., 3 times, approximately 3 times, or more than 3 times the diameter of the solder column) and typically not greater than eight (8×) times the diameter of the solder column (e.g., 8 times, approximately 8 times, or less than 8 times the diameter of the solder column), or from 4 times or approximately 4 times to 7 times or approximately 7 times the diameter of the solder column, or of any value, approximate value, or range of values in any of the foregoing ranges.

Table 2 below provides some examples of the minimum and maximum length of any solder column device embodiments or manufacturing method embodiments disclosed herein. Dimensions of the materials shown can be more than or less than the amounts shown.

TABLE 2

| Solder Column Diameter | Solder Column Length | | | |
| --- | --- | --- | --- | --- |
| | 3X Diameter | 4X Diameter | 6X Diameter | 8X Diameter |
| 0.20 mm | 0.60 mm | 0.80 mm | 1.20 mm | 1.60 mm |
| 0.25 mm | 0.75 mm | 1.00 mm | 1.50 mm | 2.00 mm |
| 0.30 mm | 0.90 mm | 1.20 mm | 1.80 mm | 2.40 mm |
| 0.35 mm | 1.05 mm | 1.40 mm | 2.10 mm | 2.80 mm |
| 0.40 mm | 1.20 mm | 1.60 mm | 2.40 mm | 3.20 mm |
| 0.45 mm | 1.35 mm | 1.80 mm | 2.70 mm | 3.60 mm |
| 0.50 mm | 1.50 mm | 2.00 mm | 3.00 mm | 4.00 mm |
| 0.55 mm | 1.65 mm | 2.20 mm | 3.30 mm | 4.40 mm |
| 0.55 mm | 1.65 mm | 2.20 mm | 3.30 mm | 4.40 mm |
| 0.60 mm | 1.80 mm | 2.40 mm | 3.60 mm | 4.80 mm |
| 0.70 mm | 2.10 mm | 2.80 mm | 4.20 mm | 5.60 mm |
| 0.80 mm | 2.40 mm | 3.20 mm | 4.80 mm | 6.40 mm |
| 0.90 mm | 2.80 mm | 3.60 mm | 5.40 mm | 7.20 mm |

Additionally, any solder column embodiments disclosed herein can be configured to have a braided structure with solder bonded joints between the overlapping strands that can reduce oxidation build up between intersecting strands of the braided structure. Such a configuration can support a core from collapsing while the core is in a softened or plastic or liquid condition or state.

Some embodiments disclosed herein are directed to methods and devices for constructing a braided structure integrated with the solder columns to avoid catastrophic collapse of the LGA/CGA during reflow. Some embodiments disclosed herein are directed to methods and devices for constructing the solder columns with no collapse during reflow (i.e., that are configured to withstand collapse during reflow). The braided exterior structure of some embodiments allows the column core to include readily accessible alloys which can be reflowed to bond the LGA/CGA to the PC board through a column structure without risking collapse of the column, or at least, in some embodiments, with a minimized risk of collapse of the column, as the temperature exceeds the liquidus temperature of the solder core material. Non-collapsible columns avoid changes in impedance and operating frequency (detuning) issues commonly encountered when the spacing between the LGA/CGA substrate and the PC Board is altered. Additionally some embodiments disclosed herein are directed to methods and devices for constructing a braided exterior structure that is joined into the surface of the skin of the solder columns (reducing resistance build up caused by oxidization and contamination between the exoskeleton and the core) and methods for constructing solder columns with braided exterior structures to electrically join and bond the LGA/CGA to the PCB Board using solder paste during reflow with maximum conductivity and minimum electrical resistance between the LGA/CGA and the PC Board.

Some embodiments disclosed herein are directed to methods and devices for constructing the structure of the solder columns to prevent the structure from embrittlement, disintegrating, crumbling and collapsing when the column is subject to cryogenic temperatures.

In any embodiments of manufacturing methods or solder column device embodiments disclosed herein, the solder columns can be constructed using alloys known in the art as pure indium (In) or an indium alloy such as indium-lead (InPb) or indium-lead-silver (InPbAg) or indium-silver (InAg) or indium-tin (InSn) or indium-bismuth (InBi) or indium-gallium (InGa). In some embodiments, the amount of lead (Pb) can range from 10% to 90%. In some embodiments, the amount of silver (Ag) can range from 3% to 20%. In some embodiments, the amount of tin (Sn) can range up to 52%. In some embodiments, the amount of bismuth (Bi) can range from 3% to 70%. In some embodiments, the amount of gallium (Ga) can range from 10% to 95%. Table 3 below provides some examples of the amount of indium and indium alloy by weight of the materials that can be included in the solder core of any solder column device embodiments or manufacturing method embodiments disclosed herein. The amount of the materials in some embodiments of the solder core can be more than or less than the amounts shown below. For example and without limitation, the amounts in any solder column embodiments disclosed herein can be within a range that is 10% lower to 10% higher than the values stated below, 5% lower to 5% higher than the values stated below, or any value, approximate value, or range of values in any of these ranges.

TABLE 3

| Alloy Composition | Chemical Element | Typical Percentage by Weight | |
|---|---|---|---|
| Indium | In | 99.99% In | Balance Other |
| Indium Silver | In/Ag | 97% In | 3% Ag |
|  |  | 90% In | 10% Ag |

TABLE 3-continued

| Alloy Composition | Chemical Element | Typical Percentage by Weight | |
|---|---|---|---|
| Indium-Bismuth | In/Bi | 95% In | 5% Bi |
| Indium Tin | In/Sn | 52% In | 48% Sn |
|  |  | 50% In | 50% Sn |
|  |  | 48% In | 52% Sn |
| Indium Lead | In/Pb | 95% In | 5% Pb |
|  |  | 90% In | 10% Pb |
|  |  | 80% In | 20% Pb |
|  |  | 70% In | 30% Pb |
|  |  | 60% In | 40% Pb |
|  |  | 50% In | 50% Pb |
|  |  | 40% In | 60% Pb |
|  |  | 30% In | 70% Pb |
|  |  | 25% In | 75% Pb |
|  |  | 20% In | 80% Pb |
|  |  | 10% In | 90% Pb |
|  |  | 5% In | 95% Pb |
| Indium-Lead-Silver | In/Pb/Ag | 80% In | 15% Pb |
|  |  |  | 5% Ag |
| Indium Gallium | In/Ga | 99.3% In | 0.7% Ga |
|  |  | 99.4% In | 0.6% Ga |
|  |  | 99.5% In | 0.5% Ga |
|  |  | 24.5% In | 75.5% Ga |
|  |  | 5% In | 95% Ga |

Table 4 below indicates the approximate threshold critical temperature (Tc) above the superconductivity point when the resistance of certain materials drops to zero, allowing current to flow without energy loss in applications such as quantum computers. Some of the solder column embodiments disclosed herein can be configured to operate at or lower (colder) than the threshold critical temperature of superconductivity.

TABLE 4

| | Threshold Critical Temperature (Tc) of Superconductivity | | |
|---|---|---|---|
| Material | ° K. Kelvin | ° C. Celsius | ° F. Fahrenheit |
| Indium (In) | 3.4° K. | −269.7° C. | −453.5° F. |
| Lead (Pb) | 7.2° K. | −265.9° C. | −446.7° F. |
| Niobium (Nb) | 9.3° K. | −263.9° C. | −442.9° F. |
| Tin (Sn) | 3.7° K. | −269.4° C. | −453.0° F. |

Table 5 below indicates cold and elevated operating temperatures that can be encountered, for example, in extraterrestrial or in land-based environments where any solder column device embodiments or manufacturing method embodiments disclosed herein are present. The temperatures can be more than or less than the amounts shown below, depending on factors such as the time of day, altitude, and/or location. For example and without limitation, the temperatures can be within a range that is 10% lower to 10% higher than the values stated below, 5% lower to 5% higher than the values stated below, or any value, approximate value, or range of values in any of these ranges. Some of the solder column embodiments disclosed herein can be configured to operate within the extraterrestrial and Earth-based temperature ranges indicated in Table 5 below. Some of the solder column embodiments disclosed herein can be configured to operate below the extraterrestrial and Earth-based temperature ranges indicated in Table 5 below.

TABLE 5

Extraterrestrial and Earth-Based Temperature Range

| Environment | Kelvin (° K.) Min Max | Celsius (° C.) Min Max | Fahrenheit (° F.) Min Max |
|---|---|---|---|
| Moon | 89 to 393° K. | −184 to +120° C. | −300 to +250° F. |
| Mars | 133 to 293° K. | −140 to +20° C. | −220 to +68° F. |
| Earth (Surface) | 184 to 329° K. | −89 to +56° C. | −128 to +133° F. |
| Earth (Ocean) | 271 to 303° K. | −2 to +30° C. | +28 to +86° F. |

Further, any embodiments of the solder columns disclosed herein (which is meant to include both method and apparatus embodiments) can have an In, an InPb, an InPbAg, an InSn, an InBi, or an InGa core and/or coating material. In any embodiments disclosed herein, the solder column can have an exoskeleton sleeve comprising 4, 8, 12, 16, 20, 24, 32, 48 or more strands of niobium (Nb) and niobium alloy wires, including without limitation, round wires, over any combination of the core materials disclosed herein. In some embodiments, the wires can have a 0.05 mm (0.002-inch), an approximately 0.05 mm (0.002-inch), or smaller diameter or cross-sectional width. In some embodiments, the diameter or width of the wires can be greater than 0.05 mm (0.002-inches) or approximately 0.05 mm (0.002-inches). Thus, any embodiments of the solder columns disclosed herein (which is meant to include both method and apparatus embodiments) can have an In, an InPb, an InPbAg, an InSn, an InBi, or an InGa core and/or coating material and an exoskeleton sleeve comprising 4, 8, 12, 16, 20, 24, 32, 48 or more strands of niobium (Nb) and niobium alloy round wires, which can have a 0.05 mm (0.002-inch), an approximately 0.05 mm (0.002-inch), or smaller than 0.05 mm (0.002-inch) diameter or cross-sectional size over any combination of the core materials disclosed herein. In any embodiments, the coating material can be 0.010 mm or approximately 0.010 mm to 0.050 mm or approximately 0.050 mm (0.0004~0.002-inch) thick.

Table 6 below provides some examples of the amount of niobium (Nb) and niobium alloy by weight of the materials that can be included in the exoskeleton braid of any solder column device embodiments or manufacturing method embodiments disclosed herein. The amount of the materials shown in the table below can be, in any embodiments, more than or less than the amounts shown. For example and without limitation, the amounts in any solder column embodiments disclosed herein can be within a range that is 10% lower to 10% higher than the values stated below, 5% lower to 5% higher than the values stated below, or any value, approximate value, or range of values in any of these ranges.

TABLE 6

| Alloy Composition | Chemical Element | Typical Percentage by Weight | |
|---|---|---|---|
| Niobium | Nb | 99.95% Nb | Balance Other |
| Niobium Titanium | Nb/Ti | 47% Nb | 53% Ti |
| | | 48% Nb | 52% Ti |
| | | 52% Nb | 48% Ti |
| Niobium-Tin | Nb/Sn | 97% Nb | 3% Sn |

Table 7 below provides some examples of the number of strands of niobium (Nb) and niobium alloy comprising the exoskeleton braid of any solder column device embodiments or manufacturing method embodiments disclosed herein. The number of the strands shown can be more than or less than the core material diameters shown and can be any value or ranges of values in any of the ranges below.

TABLE 7

| Solder Column Diameter | Indium Alloy Core Diameter | Number of Strands Niobium Alloy Braid |
|---|---|---|
| 0.20~0.60 mm | 0.10~0.50 mm | 4~16 |
| 0.61~0.90 mm | 0.51~0.80 mm | 8~32 |
| 0.91~2.00 mm | 0.81~1.90 mm | 16~32 |
| 2.01~3.00 mm | 1.91~2.90 mm | 16~48 |

In some embodiments, the manufacturing methods and/or solder column devices can include exoskeleton sleeves joined to indium (In) rich solder column cores using a solder immersion bath process at temperatures ranging from 118° C. or approximately 118° C. to 175° C. or approximately 175° C. For example and without limitation, the solder bath can include 95% or approximately 95% to 97% or approximately 97% indium with 3% or approximately 3% to 5% or approximately 5% silver (Ag) by weight with additives to optimize malleability resulting in a ductile column that can survive an increasing number of drop-shock test and bending test cycles. In other embodiments, the solder immersion bath process can be at 157° C. or approximately 157° C. to 170° C. or approximately 170° C. with the hot solder bath comprising 100% or approximately 100% pure indium (In) by weight with additives to optimize malleability resulting in a ductile column that can survive an increasing number of drop-shock test and bending test cycles. In other embodiments, the hot solder immersion bath process can be at 150° C. or approximately 150° C. to 170° C. or approximately 170° C. with the hot solder bath comprising 95% or approximately 95% to 97% or approximately 97% indium (In) by weight and 3% or approximately 3% to 5% or approximately 5% bismuth (Bi) by weight with additives to optimize malleability resulting in a ductile column that can survive an increasing number of drop-shock test and bending cycles. In other embodiments, the solder immersion bath process can be at approximately 125° C. to 170° C. with the solder bath including 50% to 52% or approximately 50% to approximately 52% indium (In) by weight and 48% to 50% or approximately 48% to approximately 50% tin (Sn) by weight with additives to optimize malleability resulting in a ductile column that can survive an increasing number of drop-shock test and bend testing cycles.

In any embodiments disclosed herein, 0.010 mm or approximately 0.010 mm to 0.050 mm approximately 0.050 mm (0.0004~0.002-inch) of molten indium alloy can cover the entire column or substantially the entire column. In some embodiments, at least 10% or approximately 10% of the diameter of the exoskeleton can be partially embedded into the exterior skin of the solder material during the indium alloy solder bath process. Subsequently, up to 50% or approximately 50% of the diameter of the exoskeleton can embed into the skin of the solder during attachment of the column to the LGA/CGA substrate and secondarily when the LGA/CGA is joined to the PC Board at elevated reflow temperatures above the liquidus temperature of the solder.

Any embodiments disclosed herein can comprise any combination of the foregoing methods, devices, components, materials, and any other details of the foregoing embodiments or aspects of the embodiments.

Table 8 below provides some examples of materials that can be included in the solder core, the coating, and/or the molten solder bath of any solder column device embodiments or manufacturing method embodiments disclosed herein, as well as approximate temperature ranges for coating the column and exoskeleton in a molten solder bath. In some embodiments, the solder bath is used to coat the solder core with the coating, which can include an indium or indium alloy.

TABLE 8

| Solder Core | Molten Solder Bath Coating | Molten Solder Temperature Range |
|---|---|---|
| Lead Free<br>In100, In97/Ag3,<br>In95/Bi5, In90/Ag10 | In100, In97/Ag3,<br>In95/Bi5, In52/Sn48,<br>In50/Sn50, In/Ge | 118° C.~165° C. |
| Lead Content<br>In80/Pb15/Ag5, In90/Pb10,<br>In80/Pb20 In70/Pb30,<br>In60/Pb40,<br>In50/Pb50, In40/Pb60,<br>In30/Pb70,<br>In25/Pb75, In20/Pb80 | In100, In97/Ag3,<br>In95/Bi5, In50/Sn50,<br>In52/Sn48, In/Ge,<br>In80/Pb15/Ag5 | 165° C.~175° C. |

FIG. 1 shows an embodiment of a solder column 100 that includes a solder core 30 surrounded by an exoskeleton sleeve 90 that can have a plurality of wires 11. In any embodiments disclosed herein, the wires can have a round cross-sectional shape, or a square cross-sectional shape, an oblong or oval shaped cross-sectional shape, or any other desired cross-sectional shape. In any embodiments disclosed herein, the column 100 can include a core 30 surrounded by an exoskeleton sleeve 90 comprising a plurality of wires 11 (e.g., a plurality of wire strands), which can have a round cross-section, or otherwise, or any combination of different cross-sectional shapes, with or without corner radiuses. The exoskeleton sleeve or structure 90 can include 4, 8, 12, 16, 20, 24, 32, 48 or more strands 11, or from 4 to 48 strands 11, or from 10 to 36 strands 11, or from 16 to 30 strands, or of any value or ranges of values in any of the foregoing ranges. In any embodiments, the strands can be made from or can include niobium or niobium alloy.

For example and without limitation, the amounts of niobium, by percentage of weight, contained in the exoskeleton in any solder column embodiments disclosed herein can be a minimum of 99.95% Nb, or a niobium alloy with 47% to 52% Nb and balance of 48% to 53% Ti, or a niobium alloy with 97% Nb and balance of 3% Sn.

In some embodiments, the wires 11 (which can be made of niobium, niobium alloy, or otherwise), can have a 0.05 mm (0.002 inch) diameter, or an approximately 0.05 mm (0.002 inch) diameter, or less than a 0.05 mm (0.002 inch) diameter. An example embodiment of the wire 11 is shown in FIGS. 9A and 9B. The nonlimiting example embodiment of the wire 11 shown in FIGS. 9A and 9B can be used to form any embodiments of the exoskeleton sleeves disclosed herein.

With reference to FIG. 10, a junction 50 can be formed in the exoskeleton structure 90 when one wire 11 overlaps and intersects with another wire 11, or the same wire 11 overlaps with itself. As shown in FIG. 10, an open space 40 can be formed by the boundaries of two or more overlapping wires or junctions 50 (two being shown). Two or more open spaces 40 forms a plurality of open spaces.

Some embodiments of the exoskeleton mesh can be braided in different combinations depending on how many total wires are used. Patterns with 4, 8, 12, 20, 24, 32 or 48 or more strands, or from 4 or approximately 4 to 48 or approximately 48, or from 10 or approximately 10 to 36 or approximately 36, or from 16 or approximately 16 to 30 or approximately 30 strands, or of any value or ranges of values in any of the foregoing ranges, can be used. Any embodiments of the exoskeleton disclosed herein can have, a single wire alternately passing under then over other wires 11 or over another single wire 11 or portion of the same wire. In some embodiments, increasing the number of strands, without decreasing a diameter of the strands, increases the effective amount of metal in the exoskeleton, thereby increasing the strength of the column.

In any embodiments disclosed herein, the structure or sleeve 90 can include one or more wires that are oriented at an angle that is 45° or approximately 45° relative to a longitudinal axis of the sleeve 90, or from 30°, approximately 30°, or less than 30° to 60°, approximately 60°, or more than 60°, or from 35°, approximately 35°, or less than 35° to 50°, approximately 50°, or more than 50°, or any values, approximate values, or ranges of values within any of the foregoing ranges, relative to a longitudinal axis of the sleeve 90. In the embodiment illustrated in FIG. 10, the braided mesh includes a plurality of wire strands comprising two wires 11.

In some embodiments, two or more overlapping junctions 50 form a plurality of overlapping junctions 50. A full joint electrical and mechanical connection can be formed at an overlapping junction 50 after immersing the exoskeleton sleeve structure into a molten bath of liquefied solder. During immersion into a molten solder bath, the open spaces 40 can be partially and/or fully filled with a measured volume of solder material.

The solder bath (which can be, but is not required to be, lead-free) can be configured to liquefy at 118° C. or approximately 118° C. (or from 115° C. or approximately 115° C. to 121° C. or approximately 121° C.) when the hot solder bath includes approximately 52% indium (In) and 48% tin (Sn) by weight, or 45% Indium or approximately 45% indium to 60% indium or approximately 60% indium and 55% tin or approximately 55% tin to 40% tin or approximately 40% tin by weight) to optimize malleability resulting in a ductile column that can survive an increasing number of drop-shock tests and bending cycles. Alternatively, the solder bath (which can be, but is not required to be, lead-free) can be configured to liquefy at 125° C. or approximately 125° C. (or from 120° C. or approximately 120° C. to 130° C. or approximately 130° C.) when the hot solder bath includes approximately 50% indium (In) and 50% tin (Sn) by weight to optimize malleability resulting in a ductile column that can survive an increasing number of drop-shock tests and bending cycles. Alternatively, the solder bath (which can be, but is not required to be, lead-free) can be configured to liquefy at 143° C. or approximately 143° C. (or from 140° C. or approximately 140° C. to 146° C. or approximately 146° C.) when the hot solder bath includes approximately 97% indium (In) and 3% silver (Ag) by weight to optimize malleability resulting in a ductile column that can survive an increasing number of drop-shock tests and bending cycles. Alternatively, the solder bath (which can be, but is not required to be, lead-free) can be configured to liquefy at 150° C. or approximately 150° C. (or from 145° C. or approximately 145° C. to 155° C. or approximately 155° C.) when the hot solder bath includes approximately 5% bismuth (Bi) by weight and approximately 95% Indium (In) by weight to optimize malleability resulting in a ductile column that can survive an increasing number of drop-shock tests and bending test cycles. Alternatively, the solder bath (which can be, but is not required to be, lead-free) can be configured to liquefy at 157° C. or approximately 157° C.

(or from 152° C. or approximately 152° C. to 162° C. or approximately 162° C.) when the hot solder bath includes approximately 100% Indium (In) by weight to optimize malleability resulting in a ductile column that can survive an increasing number of drop-shock tests and bending test cycles. Lead bearing molten solder bath can liquify at 154° C. or approximately 154° C. (or from 150° C. or approximately 150° C. to 160° C. or approximately 160° C.) when the hot solder bath includes approximately 80% Indium (In) and 15% lead (Pb) and 5% silver (Ag) by weight to optimize malleability resulting in a ductile column that can survive an increasing number of drop-shock tests and bending cycles.

FIG. 2A shows an embodiment of a solder column 100 with an enlarged view 200 that better shows the detail of the pattern and structure of the embodiment of the exoskeleton sleeve 90 of the solder column 100. The sleeve can include a plurality of 8, 12, 16, 32 or more, or from 4 to 48, or from 10 to 36, or from 16 to 30 strands, or of any value or ranges of values in any of the foregoing ranges, of strands of round wire 11 of any combination of the wire types disclosed herein. A junction 50 can be formed in exoskeleton structure 90, for example and without limitation, where wire 11 overlaps and intersects with another wire 11. Two or more overlapping junctions 50 form a plurality of overlapping junctions. A full joint at an overlapping junction 50 can be formed after immersing the column structure into a molten bath of liquefied solder. An open space 40 is formed between the boundaries of four overlapping junctions 50. Two or more open spaces 40 forms a plurality of open spaces 40. During immersion into a molten solder bath, the open spaces 40 will be fully filled and/or partially filled with a measured volume of material.

In some embodiments, the wire 11 can have free ends 13, as shown in FIGS. 2A and 2B. In some embodiments, the column can have a flat end at the first or top end 20 of the column, as shown in FIG. 2B. In some embodiments, the column can have a flat end at the second or bottom end 21 of the column, as shown in FIG. 2A.

Figure 3:
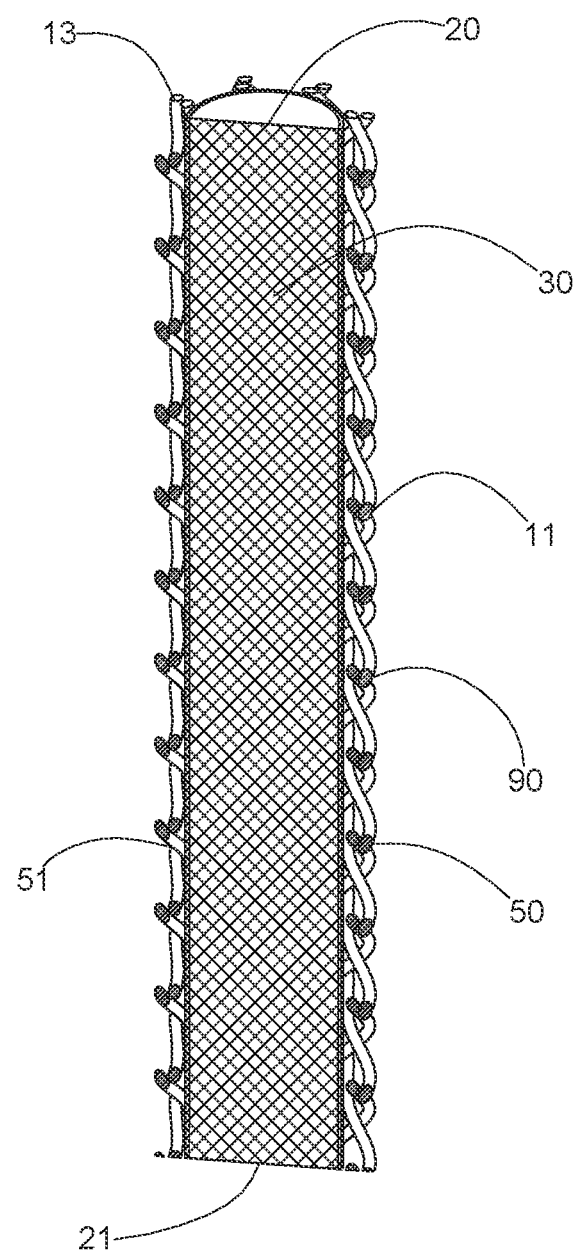
FIG. 3 is a cross-sectional perspective side view of the solder column embodiment of FIG. 1.

FIG. 3 is a section view of the embodiment of the solder column 100 shown in FIG. 2A. The embodiment of the solder column 100 shown in FIGS. 2A and 3 can have a core 30 surrounded by an exoskeleton sleeve 90. Overlapping joints 51 in the exoskeleton sleeve 90 can be bonded by immersing the column structure into a liquefied bath of molten solder.

Figure 4B:
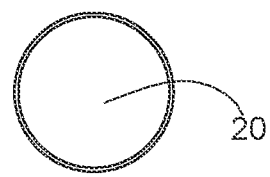
FIG. 4B is top view of the embodiment of the cylindrical solder core shown in FIG. 4A.
Figure 4C:
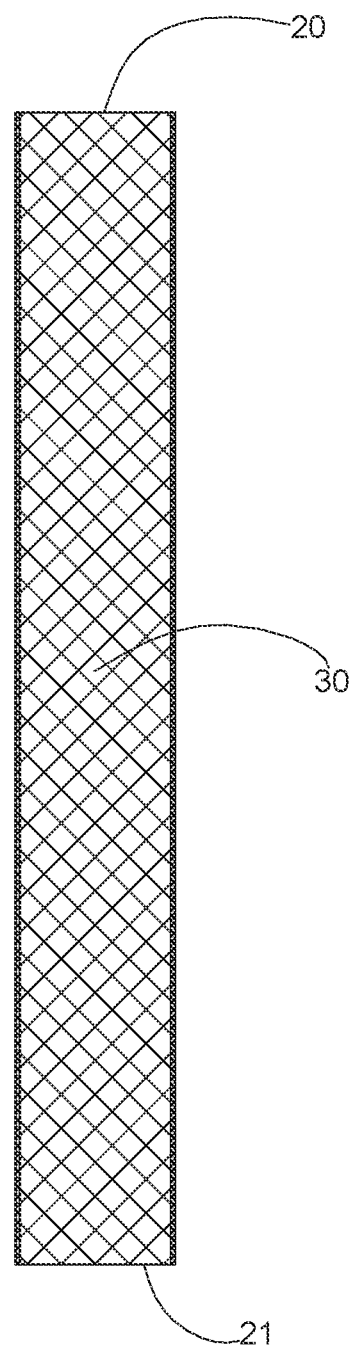
FIG. 4C is a section view of the embodiment of the cylindrical solder core shown in FIG. 4A, taken through the longitudinal axial centerline of the cylindrical solder core.
Figure 4A:
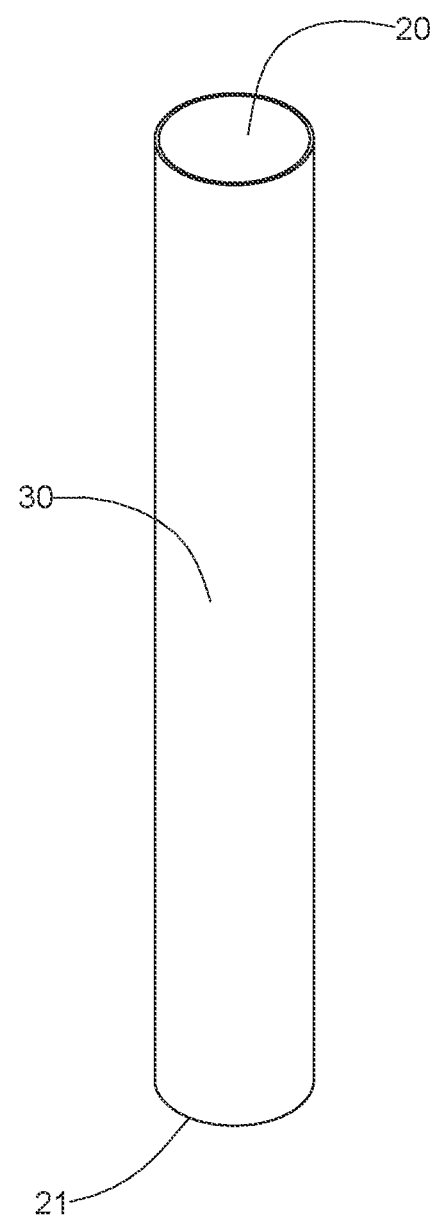
FIG. 4A is a perspective view of an embodiment of a cylindrical solder core without an exoskeleton sleeve.

FIG. 4A is a perspective view of an embodiment of a core 30 without an exoskeleton structure. FIG. 4B is a top view of the first or top end 20 of the core 30, which can be cylindrically shaped. FIG. 4C is a cross-sectional view of the embodiment of the core 30 shown in FIG. 4A. In any embodiments disclosed herein, the core 30 can include any of a range of alloys, including lead free conductive alloys, such as, but not limited to, In100, In97/Ag3, In95/Bi5, In90/Ag10, In52/Sn48 In50/Sn50, In/Ge or any combination of indium (In) over 50% or approximately 50% by weight, silver (Ag) less than or equal to 20% or approximately 20% by weight, tin (Sn) less than or equal to 52% or approximately 52% by weight, or bismuth (Bi) equal to or less than 50% or approximately 50% by weight, or Gallium (Ga) equal to or less than 50% or approximately 50% by weight.

Alternatively, any embodiments of the core 30 can include a lead bearing solder alloy of any combination of lead (Pb) over approximately 20% by weight and indium (In) remainder (balance) by weight (e.g., In80/Pb20, In70/Pb30, In60/Pb40, In50/Pb50, In40/Pb60, In25/Pb75, In20Pb80, etc.).

Figure 8:
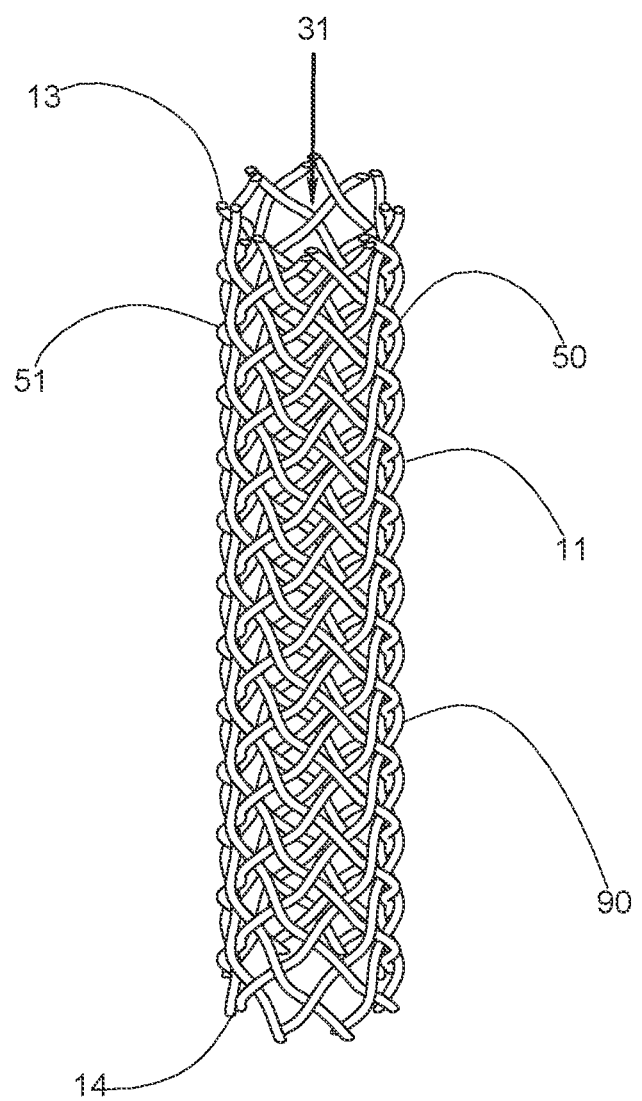
FIG. 8 is a perspective view of an embodiment of an exoskeleton sleeve, such as the exoskeleton sleeve of the embodiment of the solder column shown in FIG. 1 having an air core (i.e., without an interior solid cylindrical core).

Any embodiments of the column disclosed herein can also have coreless construction, i.e., without using physical materials or any materials for the core 30, which can be referred to as an air core 31. An embodiment of solder column having an air core is shown in FIG. 8. The coreless version can have an exoskeleton 90 formed by a plurality of wires 11. Overlapping junctions 50 of wire 11 may be coated in a liquefied molten bath of solder resulting in a plurality of joints 51. The wire 11 can have free ends 13, 14. The wire 11 in any embodiments disclosed herein can include of niobium (Nb) or indium alloy round wires 15 such as the wires shown in FIGS. 9A and 9B of approximately 0.05 mm (0.002-inch) or smaller diameter.

FIG. 5A is a perspective view of the solder column and exoskeleton sleeve embodiment shown in FIG. 1 with fillet 60 after reflowing and connecting one end of the column to a conductive pad on an LGA/CGA substrate. In some embodiments, the fillet 60 can be formed by applying a controlled thickness of solder paste onto conductive pad 70, then reflowing the column structure above the liquidus temperature of the solder paste used to form the fillet 60.

FIG. 5B is a perspective view of the solder column embodiment shown in FIG. 5A, after reflowing the other end of the column to a conductive pad on the PC Board with fillet 61 joining the column structure to the conductive land pad 71 on the PC Board. Fillet 61 can be formed by applying a controlled thickness of solder paste onto a conductive pad 71, then reflowing the column structure above the liquidus temperature of the solder paste used to form fillet 61.

FIG. 6A is a cross-sectional view of the solder column embodiment shown in FIG. 5A attached to an LGA/CGA substrate. FIG. 6B is a perspective view of the cross-section of the solder column and exoskeleton sleeve embodiment shown in FIG. 6A.

Figure 7A:
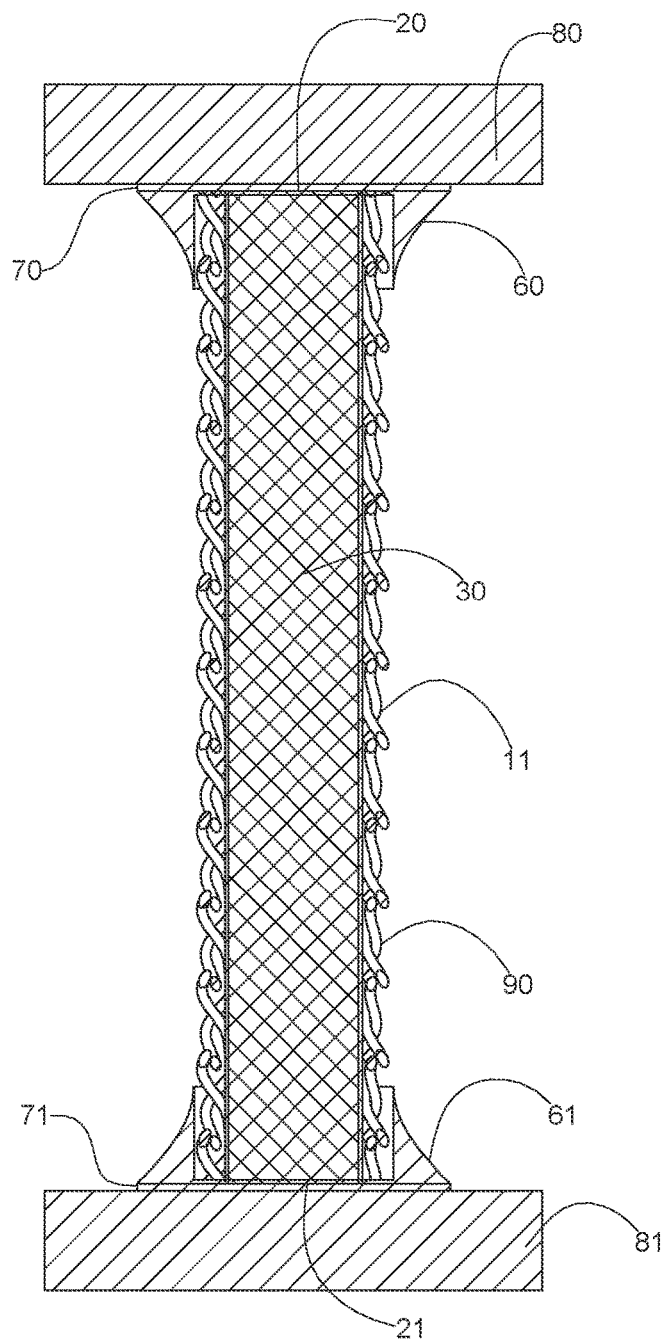
FIG. 7A is a sectional view of the solder column embodiment shown in FIG. 5B.
Figure 7B:
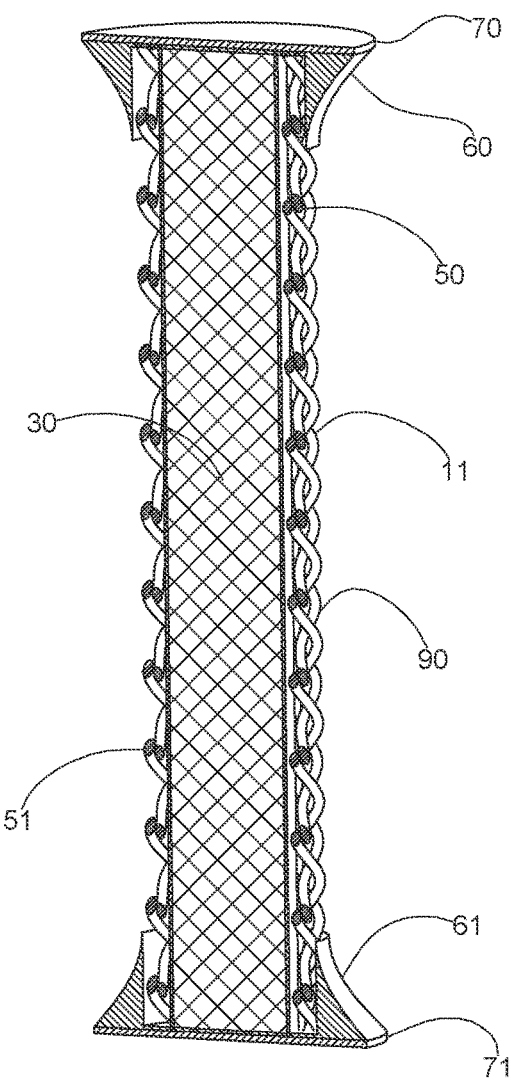
FIG. 7B is a perspective cross-sectional view of the solder column embodiment shown in FIG. 7A.

FIG. 7A is a sectional view of the solder column embodiment shown in FIG. 5B coupled with an LGA/CGA substrate and a PC Board. FIG. 7B is a perspective view of the solder column embodiment shown in FIG. 7A. These figures show an embodiment of an LGA/CGA substrate 80 and the PC Board 81.

FIG. 8 is a perspective view of an embodiment of an exoskeleton sleeve, such as the exoskeleton sleeve of the solder column embodiment shown in FIG. 1, having an air core (i.e., without an interior solid cylindrical core).

FIG. 9A is a partial side view of an embodiment of a single strand of round wire 11 that can be used in any embodiments of the exoskeleton sleeves disclosed herein, including without limitation the exoskeleton sleeve embodiment shown in FIG. 1A. FIG. 9B is an end view of the embodiment of the strand of wire 11 shown in FIG. 9A. As described, the strand of wire 11 can have a generally round cross-section 15 in FIG. 9B. In any other embodiments, the strand or wire 11 can have an ovular or elongated cross-section.

FIG. 10 is a partial detail view of an exoskeleton sleeve 90 comprising a wire braid or mesh of overlapping wire strands that can include any embodiments of the wire strands disclosed herein or any combination of the wire strands disclosed herein, including without limitation the wire strands shown in FIG. 9A, showing overlapping junction 50 and a plurality of immersion soldered joints 51, and an open area 40 between the overlapping wires. Stress caused by CTE mismatch between the LGA/CGA substrate and PCB Board can be absorbed in the open spaces 40 together with the inherent elasticity of the column structure 100 resulting in prolonged operating life of the system.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. May be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A solder column comprising:
  a solder core comprising a solder core material;
  an exoskeleton sleeve structure coupled with the solder core, the exoskeleton sleeve at least partially surrounding the solder core, wherein the exoskeleton sleeve structure comprises a plurality of wires that at least partially surround the solder core; and
  a plurality of spaces formed in the exoskeleton between the plurality of wires, wherein the spaces provide additional flexibility to the solder column to improve the ability of the solder column to absorb stresses caused by mismatches in the coefficient of thermal expansion between the substrates interconnected by the solder column;
  wherein:
    the solder core comprises at least 20% indium by weight; and the plurality of wires each comprises at least 20% Niobium by weight.

2. The solder column of claim 1, wherein the solder core comprises at least 50% indium by weight.

3. The solder column of claim 1, wherein the solder core comprises at least 80% indium by weight.

4. The solder column of claim 1, wherein the exoskeleton sleeve structure comprises a plurality of wires that are braided together to form a woven mesh that at least partially surround the solder core.

5. The solder column of claim 1, wherein the plurality of wires of the exoskeleton sleeve structure each comprises at least 50% niobium by weight.

6. The solder column of claim 1, wherein the plurality of wires of the exoskeleton sleeve structure each comprises at least 80% niobium by weight.

7. The solder column of claim 1, wherein the exoskeleton sleeve at least partially surrounds and supports the solder core at elevated temperatures exceeding a liquidus temperature of the solder core to prevent a collapse of the solder core at elevated temperatures exceeding the liquidus temperature of the solder core.

8. The solder column of claim 1, wherein the solder column is configured such that solder from the solder core will form a bond with conductive pads of a land grid array or a column grid array and/or a printed circuit board without the solder core collapsing when a temperature that the solder column is exposed to falls below the ductile to brittle transition temperature of the solder core material.

9. The solder column of claim 1, wherein at least a portion of a thickness of the exoskeleton sleeve is embedded into the solder core.

10. The solder column of claim 1, wherein the exoskeleton sleeve comprises 4, 8, 12, 16, 20, 24, 32 or 48 strands of wire.

11. The solder column of claim 1, wherein one or more of the wires has a diameter of approximately 0.002 inches (0.05 mm) or less.

12. The solder column of claim 1, wherein the exoskeleton sleeve comprises a first wire that overlaps and intersects with a second wire at approximately a 90° angle relative to the second wire.

13. The solder column of claim 1, wherein the plurality of spaces is partially or fully filled with solder comprising 100% by weight Indium or an Indium alloy comprising at least 75% Indium by weight.

14. The solder column of claim 1,
wherein the exoskeleton sleeve structure comprises a plurality of wires that form a mesh that is configured to support the solder core, particularly at elevated temperatures exceeding a liquidus temperature of the solder core, and to improve the functionality of the solder column at low cryogenic operating temperatures.

15. The solder column of claim 1, further comprising a solder coating covering the solder core and the exoskeleton sleeve, wherein the solder coating comprises at least 50% indium by weight.

16. A printed circuit board comprising the solder column of claim 1, wherein the circuit board is configured such that solder from the solder core will form a bond with conductive pads of the printed circuit board without the solder core collapsing when a temperature that the solder column is exposed to rises above the liquidus temperature of the solder core material.

17. A land grid array comprising the solder column of claim 1, wherein the land grid array is configured such that solder from the solder core will form a bond with conductive pads of the land grid array without the solder core collapsing when a temperature that the solder column is exposed to rises above the liquidus temperature of the solder core material.

18. A column grid array comprising the solder column of claim 1, wherein the column grid array is configured such that solder from the solder core will form a bond with conductive pads of the column grid array without the solder core collapsing when a temperature that the solder column is exposed to rises above the liquidus temperature of the solder core material.

19. A method of making a connection on a printed circuit board, comprising bonding an end of the solder column of claim 1 to a printed circuit board to conduct electrical signals through the solder column between a semiconductor module and the printed circuit board.

20. A method of making the solder column of claim 1, comprising:
providing the solder core; and
covering an outer surface of the solder core with the exoskeleton sleeve structure.

21. The method of claim 20, wherein the exoskeleton sleeve structure comprises 8 to 16 small diameter niobium wires.

22. The method of claim 20, further comprising coating the solder core and the exoskeleton sleeve structure with a layer of an indium alloy, wherein the layer of the indium alloy covers the exoskeleton sleeve structure and the solder core.

23. The method of claim 22, wherein the layer of the indium alloy bonds the exoskeleton sleeve structure to the solder core.

24. The method of claim 20, wherein the exoskeleton sleeve structure is configured to limit deformation of the solder core when the solder column is subjected to elevated temperatures exceeding a liquidus temperature of the solder core during a coating process and during post-manufacturing operations, and is configured to limit the deformation of the solder core when the solder column falls below a ductile to brittle transition temperature during exposure to low cryogenic temperatures.

25. The method of claim 20, wherein the solder column is mechanically compliant and capable of operating at low cryogenic temperatures and at elevated temperatures for applications found in extraterrestrial space exploration as well as for quantum computing and AI computing in datacenters.

* * * * *